(12) United States Patent
Lee et al.

(10) Patent No.: US 9,148,093 B2
(45) Date of Patent: Sep. 29, 2015

(54) LOW-COST DIGITAL PREDISTORTION APPARATUS AND METHOD USING ENVELOPE DETECTION FEEDBACK

(71) Applicant: KOREA ADVANCED INSTITUTE OF SCIENCE AND TECHNOLOGY, Daejeon (KR)

(72) Inventors: Yong Hoon Lee, Daejeon (KR); Jin Hyun So, Seoul (KR); Eui Rim Jeong, Daejeon (KR); Sung Ho Choi, Daejeon (KR); Seung Hyeok Ahn, Gyeonggi-do (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 43 days.

(21) Appl. No.: 14/067,421

(22) Filed: Oct. 30, 2013

(65) Prior Publication Data

US 2014/0118066 A1    May 1, 2014

(30) Foreign Application Priority Data

Oct. 31, 2012  (KR) .................... 10-2012-0122302

(51) Int. Cl.
*H03F 1/32* (2006.01)
*H03F 3/24* (2006.01)

(52) U.S. Cl.
CPC ............. *H03F 1/3247* (2013.01); *H03F 3/24* (2013.01); *H03F 2200/102* (2013.01); *Y02B 60/50* (2013.01)

(58) Field of Classification Search
USPC ................. 330/149; 455/144.3; 375/296–297
See application file for complete search history.

(56) References Cited

U.S. PATENT DOCUMENTS

| 6,246,286 | B1* | 6/2001 | Persson ..................... 330/149 |
| 8,410,850 | B2* | 4/2013 | Mazzucco et al. ........... 330/149 |
| 2005/0157814 | A1 | 7/2005 | Cova et al. |

FOREIGN PATENT DOCUMENTS

| KR | 10-2010-0108546 A | 10/2010 |
| KR | 10-2010-0137000 A | 12/2010 |
| KR | 10-2011-0068701 A | 6/2011 |
| KR | 10-2012-0070143 A | 6/2012 |
| KR | 10-2012-0070144 A | 6/2012 |
| KR | 10-2012-0110311 A | 10/2012 |

* cited by examiner

*Primary Examiner* — Hieu Nguyen
(74) *Attorney, Agent, or Firm* — Rabin & Berdo P.C.

(57) ABSTRACT

Disclosed herein is a low-cost digital predistortion apparatus using envelope detection feedback. The low-cost digital predistortion apparatus includes a digital predistortion unit and an envelope detection feedback unit. The digital predistortion unit converts the output of a predistorter into analog signals, frequency-modulates the analog signals into a pass band signal, and amplifies the frequency-modulated signal via a power amplifier. The envelope detection feedback unit converts the difference between the input and output of the power amplifier of the digital predistortion unit and the output of the power amplifier into baseband signals, respectively, converts the baseband signals into digital signals, estimates the nonlinear distortion characteristic output of the power amplifier, calculates a predistortion parameter that is used to compensate for the estimated nonlinear distortion characteristic output of the power amplifier.

9 Claims, 12 Drawing Sheets

LOW-COST DIGITAL PREDISTORTION APPARATUS AND METHOD USING ENVELOPE DETECTION FEEDBACK

BACKGROUND OF THE INVENTION

1. Field of the Invention

The present invention relates generally to a predistortion (PD) apparatus and method for the linearization of a power amplifier at the transmitter of a wireless communication system and, more particularly, to a low-cost digital predistortion apparatus and method using envelope detection feedback, in which a feedback method required for a transmitter having a predistortion function has been simplified into an envelope detection method, thereby providing a predistortion function.

2. Description of the Related Art

Power amplifiers are essential to communication systems, and generally have nonlinear characteristics. Spectral regrowth (or spectral broadening) that causes interference between adjacent channels and inband distortion that causes a reduction in bit error rate (BER) performance at a receiving end, chiefly result from the nonlinearity of a power amplifier.

In order to compensate for such nonlinearity, various linearization techniques, such as RF feed-forward, RF feedback, RF/IF pre-distortion and post-distortion have been proposed. Of these techniques, a digital predistortion (DPD) technique has been recognized as a powerful method suitable for recent wireless communication systems that transmit wideband signals with high peak-to-average power ratio.

Digital predistortion is a technique that implements a predistorter having the inverse characteristics of a power amplifier in a baseband in a digital manner and makes a signal, inversely distorted via the predistorter, have linear characteristics while passing through the nonlinear characteristics of the power amplifier.

FIG. 1 is a block diagram illustrating a transmitter having a conventional predistortion function. This conventional predistortion technique requires a feedback loop for converting the output signal of an amplifier into a digital baseband signal in order to estimate the nonlinear distortion characteristics of the power amplifier and calculates a predistortion parameter that is used to compensate for the characteristics. In this case, a demodulation function is implemented using a mixer, an analog filter, etc.

Accordingly, this technology is disadvantageous in that the complexity and cost of implementation of a transmitter having a predistortion function are very high and it is difficult to apply the technology to a system having a spatial limitation, such as a terminal.

Korean Unexamined Patent Application No. 10-2012-0070144 discloses a digital predistortion power amplification apparatus and a digital synchronization control method for the apparatus.

This digital predistortion power amplification apparatus includes a power amplifier configured to amplify and output an input signal to be wirelessly transmitted via an antenna, a bias adjuster configured to change the voltage of a bias signal based on the size of the input signal and to output the changed bias signal, and a digital predistorter configured to control the delays of the input signal of the power amplifier and the bias signal in a digital manner and to thereby control the synchronization between the input signal and the bias signal.

A predistortion technique is configured to compensate for the nonlinear characteristics of a power amplifier at the input terminal of the amplifier using inverse nonlinear characteristics and to thereby make the output of the power amplifier have linear characteristics, thereby maximizing the efficiency of the power amplifier.

In the implementation of a predistortion technique, it is necessary to feed back the output of a power amplifier, convert the output into a baseband signal and detect the baseband signal. However, in order to convert an RF signal into a baseband signal, a frequency mixer and an analog filter are added to a transmitter and thus disadvantages arise in that the structure of the transmitter is complicated and the volume thereof is increased.

Accordingly, a disadvantage arises in that, although predistortion can be easily implemented in a system having a low spatial limitation, such as a base station, it is not easy to apply the predistortion technique to a system having a high spatial limitation, such as a terminal.

SUMMARY OF THE INVENTION

Accordingly, the present invention is directed to a low-cost digital predistortion apparatus and method using envelope detection feedback, which can reduce the complexity of the implementation of a feedback loop required for the implementation of predistortion in a system in which a power amplifier has been linearized by the application of a predistortion technique in order to maximize the efficiency of the power amplifier, thereby minimizing the cost and volume of implementation.

The present invention is further directed to a low-cost digital predistortion apparatus and method using envelope detection feedback, in which the demodulation function of a conventional feedback loop required for the implementation of a predistortion function has been replaced with an envelope detection method, thereby achieving predistortion performance comparable to that of the conventional method using demodulation while minimizing the cost and volume of implementation.

In accordance with an aspect of the present invention, there is provided a low-cost digital predistortion apparatus using envelope detection feedback, including a digital predistortion unit configured to convert an output of a predistorter into analog signals, to frequency-modulate the analog signals into a pass band signal, and to amplify the frequency-modulated signal via a power amplifier; and an envelope detection feedback unit configured to convert a difference between an input and output of the power amplifier of the digital predistortion unit and the output of the power amplifier into baseband signals, respectively, to convert the baseband signals into digital signals, to estimate the nonlinear distortion characteristic output of the power amplifier, to calculate a predistortion parameter that is used to compensate for the estimated nonlinear distortion characteristic output of the power amplifier.

In accordance with another aspect of the present invention, there is provided a low-cost digital predistortion method using envelope detection feedback, including the steps of: (a) converting, by a digital predistortion unit, an output of a predistorter into analog signals, frequency-modulating, by the digital predistortion unit, the analog signals into a pass band signal, and amplifying, by a digital predistortion unit, the frequency-modulated signal via a power amplifier; (b) receiving, by an envelope detection feedback unit, a difference between an input and output of the power amplifier of the digital predistortion unit and an output of the power amplifier; (c) converting, by the envelope detection feedback unit, the difference between the input and output of the power amplifier of the digital predistortion unit and the output of the power amplifier into baseband signals, respectively; (d) converting, by the envelope detection feedback unit, the baseband signals into digital signals, and estimating, by the envelope detection feedback unit, nonlinear distortion characteristics of the power amplifier; and (e) calculating, by the envelope detection feedback unit, a predistortion parameter that is used to compensate for the nonlinear distortion characteristics of the power amplifier estimated at step (d).

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
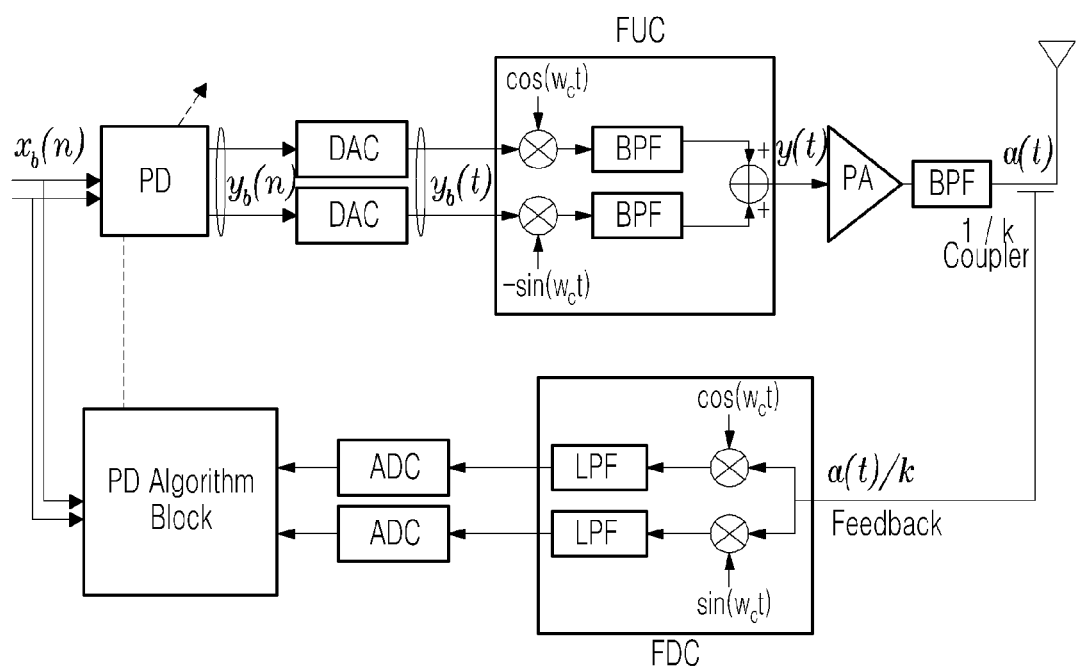
FIG. 1 is a block diagram illustrating a conventional transmitter having a demodulation function feedback loop in order to provide a conventional predistortion function (in this diagram, PD: predistorter, ADC: analog-to-digital converter, DAC: digital-to-analog converter, BPF: band pass filter, and PA: power amplifier)

Reference now should be made to the drawings, throughout which the same reference numerals are used to designate the same or similar components.

In order to overcome difficulty implementing a feedback loop, the present invention proposes a new feedback scheme. The proposed new feedback scheme employs the cheaper and simpler envelope detection method instead of the conventional demodulation method as a new feedback method, thereby enabling a digital predistortion function to be implemented using parts that are cheaper and smaller in number than those of the conventional feedback method.

Moreover, the present invention can be applied to the case where a power amplifier has a memory effect. Additionally, the present invention exhibited performance comparable to that of the conventional predistortion in spite of the fact that the structure of the feedback loops proposed by computer simulations was simple.

The present invention will be described in detail with reference to the accompanying exemplary drawings.

Figure 2:
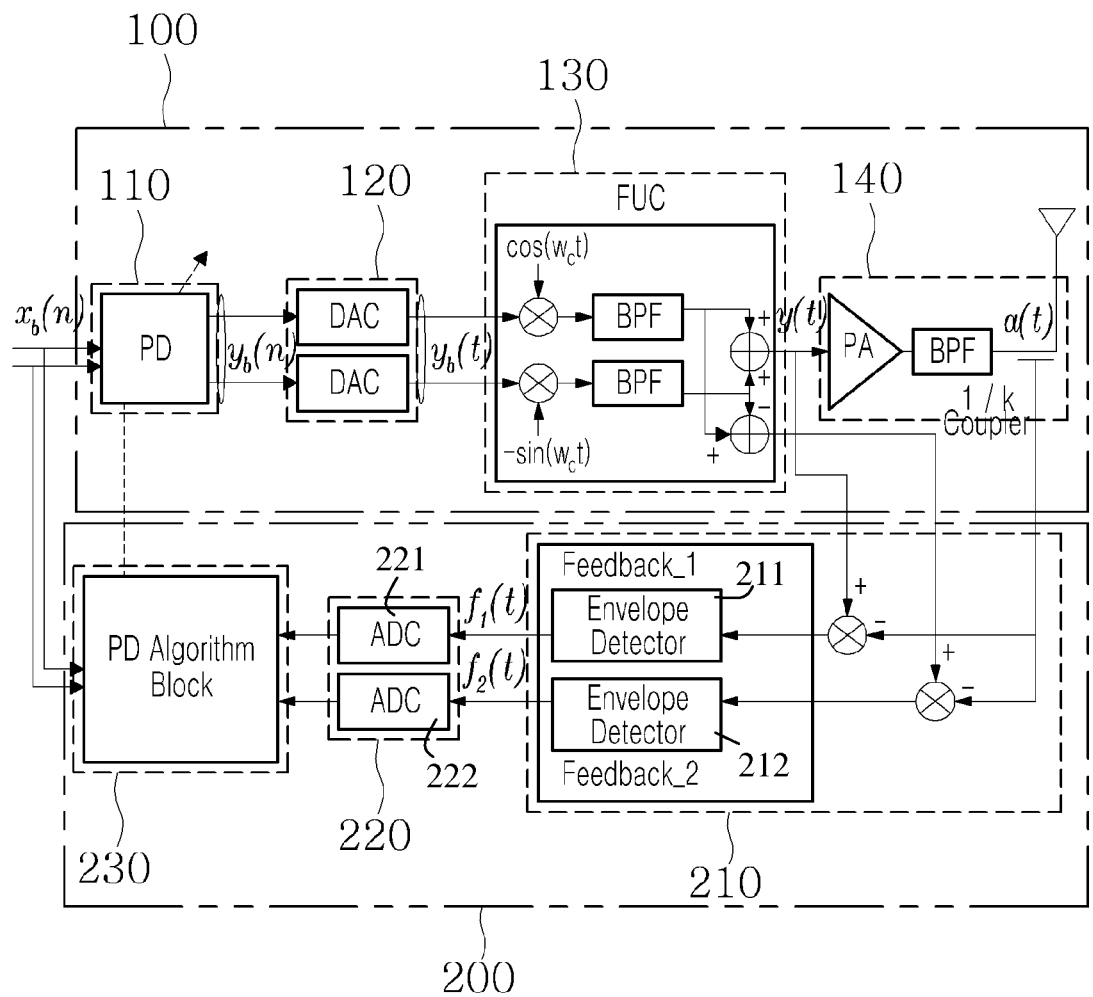
FIG. 2 is a diagram illustrating the configuration of a digital predistortion apparatus according to an embodiment of the present invention.
Figure 3:
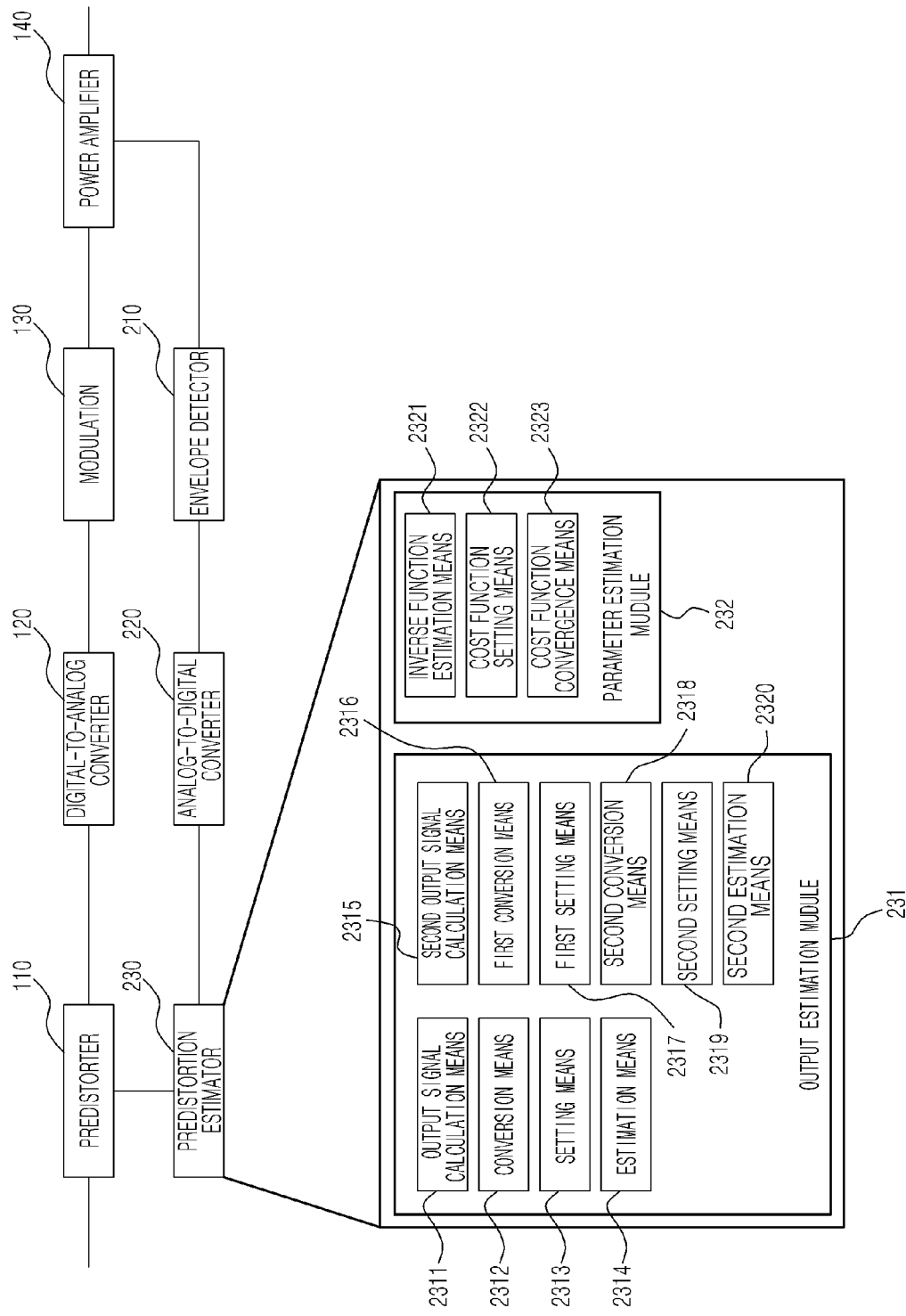
FIG. 3 is a block diagram schematically illustrating a digital predistortion apparatus according to an embodiment of the present invention.
Figure 4:
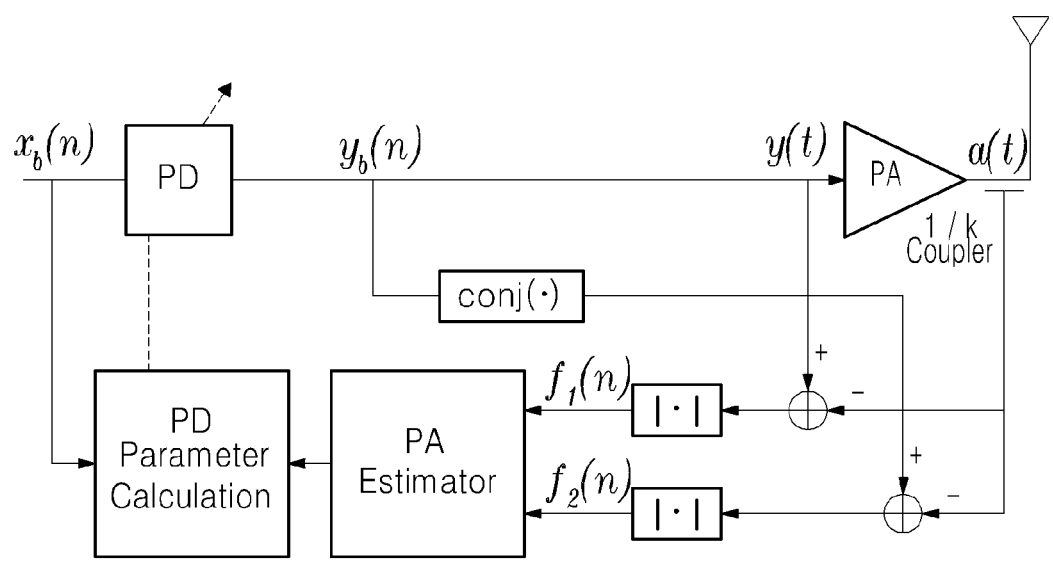
FIG. 4 is a baseband equivalent block diagram illustrating the envelope detection feedback loop-type transmitter of a digital predistortion apparatus according to an embodiment of the present invention.
Figure 5:
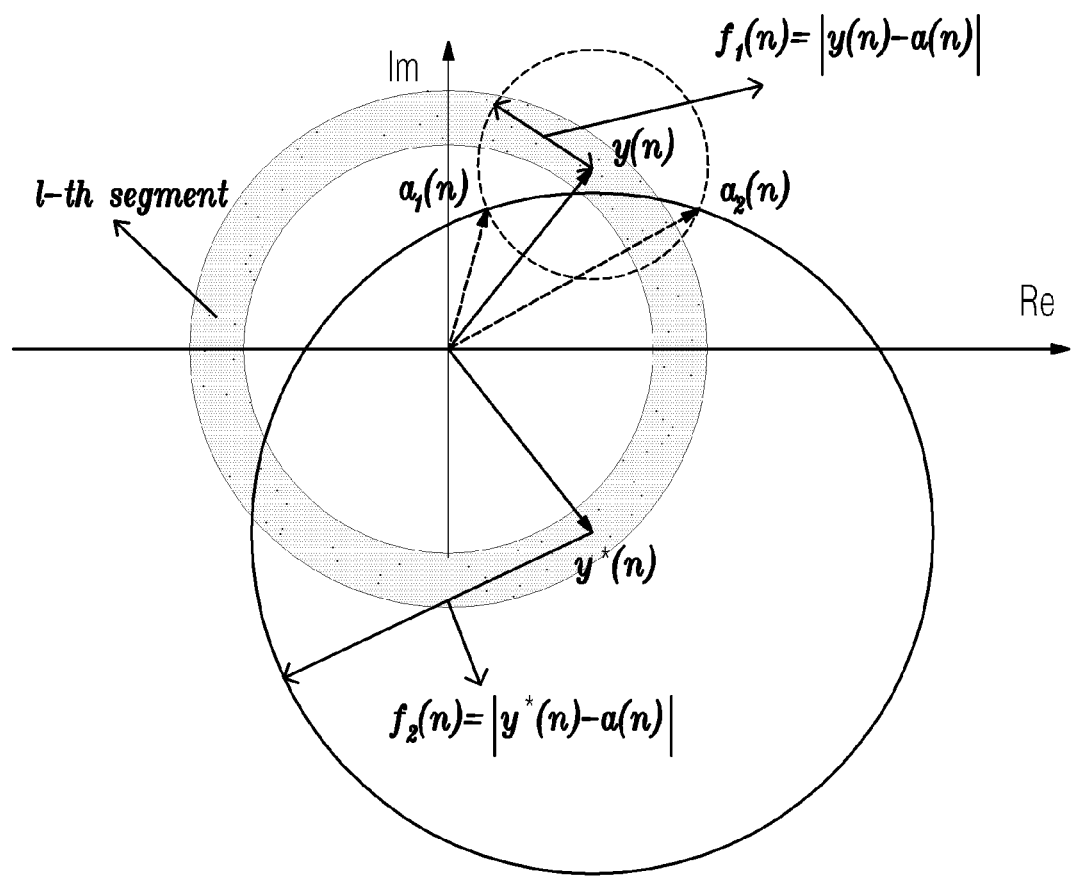
FIG. 5 is a diagram illustrating the correlations between the input and output of an amplifier in a complex plane in a digital predistortion apparatus according to an embodiment of the present invention.
Figure 6:
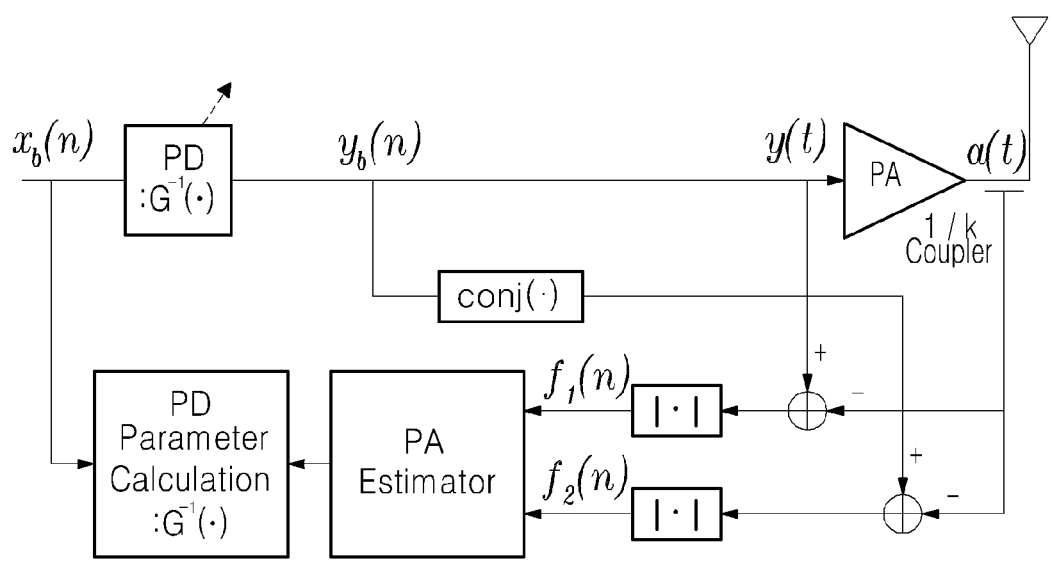
FIG. 6 is a block diagram illustrating the polynomial-type predistortion of a digital predistortion apparatus according to an embodiment of the present invention.

FIG. 2 is a diagram illustrating the configuration of a digital predistortion apparatus according to an embodiment of the present invention, FIG. 3 is a block diagram schematically illustrating a digital predistortion apparatus according to an embodiment of the present invention, FIG. 4 is a baseband equivalent block diagram illustrating the envelope detection feedback loop-type transmitter of a digital predistortion apparatus according to an embodiment of the present invention, FIG. 5 is a diagram illustrating the correlation between the input and output of an amplifier in a complex plane in a digital predistortion apparatus according to an embodiment of the present invention, and FIG. 6 is a block diagram illustrating the polynomial predistortion of a digital predistortion apparatus according to an embodiment of the present invention.

As illustrated in these drawings, a low-cost digital predistortion apparatus using envelope detection feedback according to an embodiment of the present invention includes a digital predistortion unit 100 configured to convert the output of a predistorter 110 into analog signals, to frequency-modulate the analog signals into a pass band signal, and to amplify the frequency-modulated signal via a power amplifier 140; and an envelope detection feedback unit 200 configured to convert the difference between the input and output of the power amplifier 140 of the digital predistortion unit 100 and the output of the power amplifier 140 into baseband signals, respectively, to convert the baseband signals into digital signals, to estimate the nonlinear distortion characteristic output of the power amplifier 140, and to calculate a predistortion parameter that is used to compensate for the estimated nonlinear distortion characteristic output of the power amplifier 140.

That is, the low-cost digital predistortion apparatus using envelope detection feedback according to this embodiment of the present invention is formed by combining the digital predistortion unit 100 and the envelope detection feedback unit 200 in a systematic manner.

The digital predistortion unit 100 includes a predistorter 110, a digital-to-analog converter 120, a modulation 130, and a power amplifier 140.

The predistorter PD 110 functions to bypass a multiple access modulated input signal upon initial input and to predistort an input signal using a predistortion parameter upon subsequent input.

The digital-to-analog converter 120 converts the output of the predistorter 110 into analog signals.

The modulation 130 functions to frequency-modulate the analog signals, obtained via the digital-to-analog converter 120, into a pass band signal.

The power amplifier 140 functions to amplify the signals modulated into the pass band signal via the modulation 130.

The envelope detection feedback unit 200 includes an envelope detector 210, an analog-to-digital converter 220, and a predistortion estimator 230.

The envelope detector 210 functions to convert the difference between the input and output of the power amplifier 140 and the output of the power amplifier 140 into baseband signals, respectively. The envelope detector 210 includes a first feedback module 211 configured to convert the difference between the input and the output of the power amplifier 140 into a baseband signal, and a second feedback module 212 configured to convert the difference between the complex conjugate of the input and output of the power amplifier 140 into a baseband signal. Using these two feedback loop signals, the absolute value of the output of the power amplifier 140 may be extracted via the predistortion estimator, and the converted phase shift may be estimated via the power amplifier.

The analog-to-digital converter 220 functions to convert the baseband signals, that is, the output of the envelope detector 210, into digital signals. In this case, the analog-to-digital converter 220 includes a first analog-to-digital converter module 221 configured to convert the output of the power amplifier 140 of the first one of the two feedback modules of the envelope detector 210 converted into the baseband signal into a digital signal, and a second analog-to-digital converter module 222 configured to convert the difference between the input and output of the power amplifier 140 of the second feedback module converted into the baseband signal via the envelope detector into a digital signal.

The predistortion estimator 230 functions to receive the digital signals of the analog-to-digital converter 220, to estimate the nonlinear distortion characteristic output of the power amplifier 140, and to calculate a predistortion parameter that is used to compensate for the nonlinear distortion characteristic output.

The predistortion estimator 230 that performs the above function includes an output estimation module 231 configured to receive the feedback loop signals obtained by converting the difference between the input and output of the power amplifier 140 and the output of the power amplifier 140 into the baseband signals and then converting the baseband signals into digital signals, and to estimate the nonlinear distortion characteristic output of the power amplifier 140; and a parameter estimation module 232 configured to calculate a predistortion parameter that is used to compensate for the nonlinear distortion characteristic output of the power amplifier 140 that is estimated by the output estimation module 231.

In this case, at a first step, the output estimation module 231 estimates the output of the power amplifier 140 using the feedback loop signals arriving through the envelope detector, and at a second step, the parameter estimation module 232 designs a predistorter by applying the output of the power amplifier 140 estimated at the first step to a predistortion algorithm.

The envelope detection feedback unit 200 according to an embodiment of the present invention includes output signal calculation means 2311 for performing division into a predetermined number of groups using feedback loop signals for N input signals input via the digital predistortion unit based on the sizes of the input signals of the power amplifier, and obtaining the output signals $a_1(n)$ and $a_2(n)$ of the power amplifier for each of the groups; conversion means 2312 for outputting results $c_1(n)=\text{Tran}[a_1(n)]$ and $c_2(n)=\text{Tran}[a_2(n)]$ obtained by applying the output signals of the power amplifier calculated via the output signal calculation means 2311 to a conversion function (Equation 5); setting means 2313 for setting the average value of the sums of the outputs $c_1(n)$ and $c_2(n)$ of the conversion means 2312 for each of the groups as the reference value of the group; and estimation means 2314 for estimating the output of the power amplifier using the reference value of the setting means:

$$\text{Tran}(\bullet)=(\bullet-y(n))\times e^{j\angle y(n)} \qquad (5)$$

where $\text{Tran}(\bullet)$ is the conversion function, $y(n)$ is the input signals of the power amplifier, and $\angle y(n)$ is the phase of $y(n)$.

Furthermore, the envelope detection feedback unit 200 includes second output signal calculation means 2315 for performing division into a predetermined number of groups using the feedback loop signals for the N input signals input via the digital predistortion unit 100 based on the size of the current input signal (an i-th input signal) of the power amplifier and the size of a previous input signal (a j-th input signal), and obtaining the output signals $a_1(n)$ and $a_2(n)$ of the power amplifier for each of the groups; first conversion means 2316 for outputting results $c_1(n)=\text{Tran1}[a_1(n)]$ and $c_2(n)=\text{Tran1}[a_2(n)]$ obtained by applying the output signals of the power amplifier calculated via the second output signal calculation means 2315 to a conversion function (Equation 10); first setting means 2317 for setting the average value of the sums of the outputs $c_1(n)$ and $c_2(n)$ of the first conversion means 2316 for each of the groups as the reference value of each of the groups; second conversion means 2318 for outputting results $t_1(n)=\text{Tran2}[a_1(n)]$ and $t_2(n)=\text{Tran2}[a_2(n)]$ obtained by applying a second conversion function (Equation 13) to each of the groups using the reference value of the second setting means; second setting means 2319 for setting the average value of the sums of the outputs $t_1(n)$ and $t_2(n)$ of the second conversion means 2318 for each of the groups as the reference value of each of the groups; and second estimation means 2320 for estimating the output of the power amplifier using the reference value of the second setting means 2319:

$$\text{Tran1}(\bullet)=(\bullet-y(n_i^j))\times e^{j\angle y(n_i^j)} \qquad (10)$$

where $\text{Tran}(\bullet)$ is the conversion function, $y(n)$ is the input signals of the power amplifier, $\angle y(n)$ is the phase of $y(n)$, and $n_i^j$ is an index indicating that the current input belongs to an i-th interval and the previous input belongs to a j-th interval, and $$\text{Tran2}(\bullet)=[\{(\bullet-y(n_i^j))\times e^{-j\angle y(n_i^j)}-M_i\}]e^{j\angle y(n_i^j)-\angle y(n_i^j-1)} \qquad (13)$$

where $M_i$ is the first reference value, $y(n)$ is the input signals of the power amplifier, $\angle y(n)$ is the phase of $y(n)$, and $n_i^j$ is an index indicating that the current input belongs to an i-th interval and the previous input belongs to a j-th interval.

The envelope detection feedback unit 200 includes inverse function estimation means 2321 for estimating an inverse function using an estimated value $\hat{a}(n)$ obtained by estimating the nonlinear distortion characteristic output of the power amplifier 140; cost function setting means 2322 for setting a cost function that is used to update the parameter of the inverse function of the power amplifier estimated via the inverse function estimation means 2321; and cost function convergence means 2323 for making the cost function of the cost function setting means 2322 converge and then applying the corresponding parameter to the predistorter.

The estimated value $\hat{a}(n)$ is $$\hat{a}(n) = G(y(n)) = \sum_{k=1}^{L} w_k^*|y(n)|^{2(k-1)}y(n) = w^H y(n),$$

where $2L-1$ is the nonlinear order of the power amplifier, $w_k$ is a parameter indicative of the characteristics of the power amplifier, $w=[w_1, w_2, \ldots, w_T]^T$, and $y(n)=[y(n), |y(n)|^2 y(n), \ldots, |y(n)|^{2(L-1)}y(n)]^T$.

The inverse function is $$y(n) = G^{-1}(x(n)) = \sum_{k=1}^{Q} h_k^* |x(n)|^{2(k-1)} x(n) = h^H x(n),$$

where 2Q−1 is the nonlinear order of the power amplifier, $\{h_k\}$ a parameter indicative of the characteristics of the power amplifier, $h = [h_1, h_2, \ldots, h_Q]^T$, and $x(n) = [x(n), |x(n)|^2 x(n), \ldots, |x(n)|^{2(Q-1)} x(n)]^T$.

The cost function is $\epsilon_h = E[|e_h(n)|^2]$, where the cost function convergence is $$h(n+1) = h(n) - \mu D \frac{\partial \epsilon_h}{\partial h^*} = h(n) + \mu D \epsilon_h^* \hat{a}(n),$$

μ is a step size, and D is a diagonal scaling matrix that is used to improve convergence speed.

The estimation of the output of the power amplifier and the estimation of the parameter will be described in detail below.

First, as illustrated in FIGS. 2 and 3, in the low-cost digital predistortion apparatus using envelope detection feedback according to this embodiment of the present invention, a transmitter block having a new structure is proposed to replace a feedback loop having a conventional demodulation function with feedback loops having envelope detectors.

In order to facilitate the structure and algorithm of the transmitter proposed by this embodiment of the present invention, the case where a power amplifier has no memory effect (in the case of a narrowband transmission system) will be described.

Meanwhile, extension to a power amplifier having a memory effect (in the case of a broadband transmission system) may be easily achieved using a model, for example, a block-based model, such as a well-known Wiener or Hammerstein model, or a memory polynomial model.

In general, in a conventional predistortion method, a predistorter PD is constructed by extracting the gain and phase shift of the output signals of the power amplifier through the demodulation of the output of the amplifier in feedback loops, estimating the nonlinear characteristics of the power amplifier in a baseband, performing modeling, and calculating the inverse characteristics thereof in a predistortion algorithm.

However, in this embodiment of the present invention, in order to replace the conventional demodulation function using an envelope detector, two feedback loops are constructed.

In this case, one feedback loop converts the output of the power amplifier into a baseband signal via the envelope detector and then converts the baseband signal into a digital signal via the ADC. Although the absolute value of the output of the amplifier can be extracted using this feedback loop signal, a phase shift at the output end of the amplifier cannot be detected using only the feedback loop signal.

To overcome this problem, the difference between the input and output of the amplifier is converted into a baseband signal via the envelope detector and then into a digital signal via the ADC.

The phase shift made via the power amplifier may be estimated using this signal. A detailed description thereof will be given below.

In FIG. 4, the transmission block of FIG. 2 has been converted into a baseband equivalent block, in which case it is assumed that only a fundamental frequency band signal is output as the final output of the amplifier and an ideal envelope detector is assumed.

Based on the block diagram of FIG. 4, a predistortion algorithm including two steps will be described below.

At the first step, the output of the power amplifier is estimated using the feedback loop signal arriving through the envelope detector, and at the second step, a predistorter is designed by applying the estimated output of the amplifier to the predistortion algorithm. The estimation of the parameter of the predistorter will be described using a polynomial predistortion method as an embodiment.

—Estimation of Output of Power Amplifier (Output Estimation Module)—

In the conventional predistortion method, a receiver through demodulation is installed in the feedback loop of the output of the amplifier, and thus it is possible to fully determine information about the amplitude and phase of the output of the power amplifier.

Unlike this, in this embodiment of the present invention, only the feedback signals having passed through two envelope detectors are received, and thus the step of estimating the output of the power amplifier using the feedback signals is required.

As illustrated in FIG. 4, the two feedback signals received through the two feedback loops are computed using the following Equation 1:

$$f_1(n) = |y(n) - a(n)|$$

$$f_2(n) = |y^*(n) - a(n)| \quad (1)$$

In the above equation, a(n) corresponds to the output signal of the power amplifier, and y(n) corresponds to the input signal of the power amplifier. The K value of FIG. 4 is an attenuation factor, and is assumed to be 1 for ease of description. That is, it is intended that the output of the power amplifier is accurately estimated through y(n) and y*(n) known because they are transmission signals and two signals $f_1(n)$ and $f_2(n)$ received through feedback.

When it is assumed that the characteristics of the power amplifier satisfy partial linear characteristics, the maximum value of the input of the power amplifier is set to $\Psi$ and division to L segments is performed based on the size of input (that is, $0 = \Psi_0 \leq \Psi_1 \leq \ldots \leq \Psi_{L-1} = \Psi$) in order to simplify the estimation issue, the characteristic function G(•) of the power amplifier may be represented by the following Equation 2:

$$G(y(n)) = K_l e^{j\theta_l} y(n), \Psi_{l-1} \leq y(n) \leq \Psi_l \quad (2)$$

where $K_l(>0)$ and $\theta_l$ are the characteristics of the size and phase of the power amplifier, respectively. If y(n) belongs to a l-th segment, respective signals are represented by a vector diagram, as illustrated in FIG. 5.

In FIG. 5, a gray circle represents a l-th segment. If $f_1(n)$ is a first feedback signal, first feedback signal $f_1(n)$ indicates the distance from y(n) to a(n), and thus a(n) is located on a solid circle.

That is, in Equation 1, y(n), y*(n), $f_1(n)$ and $f_2(n)$ are known and a(n) is intended to be obtained, this is the same as the fact that a single unknown complex value is obtained from two equations.

Accordingly, one of the intersections $a_1(n)$ and $a_2(n)$ of the two circles becomes a(n). The determination of which of the two intersections is true a(n) is an issue.

To carry out the determination, the two intersections will be discussed in more detail. If it is assumed that intersection $a_1(n)$ is true a(n), $a_1(n) = K_l e^{j\theta_l} y(n)$ is obtained from Equation 2.

The following characteristics can be found from FIG. 5:

$$\text{Real}[a_2(n)] = \text{Real}[2y(n) - a_1(n)]$$

$$\text{Imag}[a_2(n)] = \text{Imag}[a_1(n)] \quad (3)$$

$$a_2(n) = y(n) + y^*(n) - K_l^* y^*(n) \quad (4)$$

To discuss the operations of $a_1(n)$ and $a_2(n)$, the following conversion function is defined. The physical meaning of this conversion function is that y(n) is translated so that it is located at (0, 0) and the direction of vector y(n) is rotated so that it coincides with an x axis. The conversion function may be expressed by the following Equation 5:

$$\text{Tran}(\bullet) = (\bullet - y(n)) \times e^{j\angle y(n)} \quad (5)$$

where $\angle y(n)$ is the phase of y(n). If the results obtained by applying $a_1(n)$ and $a_2(n)$ to the conversion function of Equation 5 are $c_1(n)$ and $c_2(n)$, $c_1(n)$ and $c_2(n)$ may be expressed by the following Equation 6:

$$c_1(n) = |y(n)|\{K_l e^{j\theta_l} - 1\}$$

$$c_2(n) = |y(n)| e^{-j2\angle y(n)} \{1 - K_l e^{j\angle y(n)}\} \quad (6)$$

If it is assumed that the size and phase of input signal $\{y(n)\||y(n)|\epsilon(\Psi_{l-1}, \Psi_l)\}$ that belongs to an i-th segment are uniformly distributed at $(\Psi_{l-1}, \Psi_l)$ and $(0, 2\pi)$, respectively, the following characteristics can be found:

$$E[c_1(n)] = \frac{\Psi_{l-1} + \Psi_l}{2}\{K_l e^{j\theta_l} - 1\} \quad (7)$$

$$E[c_2(n)] = 0$$

That is, if the true output values of the power amplifier are converted, an almost uniform value is always obtained. If erroneous intersections are converted, different values are obtained, and the average thereof is 0. The following selection process can be devised. This may be summarized in the following Table 1:

TABLE 1

1. N samples are sent, and feedback signals for these N samples are stored.
2. Division into L groups is performed based on the size of the input of the power amplifier.
3. $a_1(n)$ and $a_2(n)$ are obtained for each of the groups, and the values $c_1(n) = \text{Tran}[a_1(n)]$ and $c_2(n) = \text{Tran}[a_2(n)]$ obtained by applying $a_1(n)$ and $a_2(n)$ to Equation 5 are calculated.
4. The average value of $c_1(n) + c_2(n)$ is calculated for each of the groups. If calculation is performed for a sufficient number of samples, this average value becomes the reference value of each of the groups.
5. Once the reference value has been obtained, the true output of the power amplifier is selected between intersections with respect to newly arriving samples using the following equation:

$$\hat{a}(N_i^j + 1) = \arg\min(\|\text{Tran}(a_1(N_i^j + 1)) - R_i^j\|, \|\text{Tran}(a_2(N_i^j + 1)) - R_i^j\|)$$

where $$R_i^j = \sum_{n_i^j = 1}^{N_i^j} [\text{Tran}(a_1(n_i^j)) + \text{Tran}(a_1(n_i^j))]$$

Next, the case where there is a memory effect will be described below.

When a broadband signal is used, a memory effect in which the output of a power amplifier is affected by both a current input and a previous input occurs.

In this case, when the output of the power amplifier is estimated using the above-described method, an error occurs because a previous value is not taken into account, and thus a countermeasure is required. In the case where there is a memory effect, it is possible to obtain two intersections from a feedback signal, like in the case where there is no memory effect, and also the problem of selecting a true output between the two intersections remains.

In order to derive a selection algorithm in the case where there is a memory effect, the characteristics of a power amplifier are modeled by a memory polynomial. For the sake of explanation, a 2-tap 5th order memory polynomial is used as an embodiment. In this case, the output of the power amplifier is expressed as follows:

$$a(n) = c_1 y(n) + c_2 y(n)|y(n)|^2 + c_3 y(n)|y(n)|^4 + c_4 y(n-1) + c_5 y(n-1)|y(n-1)|^2 + c_6 y(n-1)|y(n-1)|^4 \quad (8)$$

When division into L segments is performed based on the size of the input of the power amplifier as in the case where there is no memory effect, and a current input is an i-th input and a previous input is a j-th input, $$a(n_i^j) = c_1 y(n_i^j) + c_2 y(n_i^j)|y(n_i^j)|^2 + c_3 y(n_i^j)|y(n_i^j)|^4 + c_4 y(n_i^j - 1) \quad (8)$$

$$+ c_5 y(n_i^j - 1)|y(n_i^j - 1)|^2 + c_6 y(n_i^j - 1)|y(n_i^j - 1)|^4$$

$$= y(n_i^j)\{c_1 + c_2|y(n_i^j)|^2 + c_3|y(n_i^j)|^4\} + y(n_i^j - 1)$$

$$\{c_4 + c_5|y(n_i^j - 1)|^2 + c_6|y(n_i^j - 1)|^4\}$$

$$\approx K_i y(n_i^j) + K_j y(n_i^j - 1)$$

If division into a sufficient number of segments is performed, the third equal sign becomes valid. $K_i$ and $K_j$ are complex constants, and are representative of the characteristics of the power amplifier in the i-th segment and the characteristics of the power amplifier in the j-th segment, respectively. $n_i^j$ is an index indicating that the current input belongs to an i-th segment and the previous input belongs to a j-th segment. In Equation 9, the output of the power amplifier is estimated using the fact that the output of the power amplifier is represented by the weighted sum of the current input and the previous input. For this purpose, two types of conversion functions will be defined below.

A first conversion function is defined, as follows:

$$\text{Tran1}(\bullet) = (\bullet - y(n_i^j)) \times e^{j\angle y(n_i^j)} \quad (10)$$

This function is the same as the conversion function of Equation 5. When the phases and sizes of input are uniformly distributed as in Equation 5, the following characteristics are satisfied:

$$E[\text{Tran1}(a_1(n_i^j))] = \frac{\Psi_i + \Psi_{i-1}}{2}(K_i - 1) \quad (11)$$

$$E[\text{Tran1}(a_2(n_i^j))] = 0$$

Using this characteristic, the first reference value of each segment will be defined as follows:

$$M_i \triangleq \sum_{j=1}^{L} \left[ \sum_{n_i^j = 1}^{N_i^j} \text{Tran1}(a_1(n_i^j)) + \text{Tran1}(a_2(n_i^j)) \right] \quad (12)$$

$$= \frac{\Psi_i + \Psi_{i-1}}{2}(K_i - 1)$$

From Equation 12, it can be seen that the characteristic of a segment to which the current input belongs can be determined based on the first conversion function and the average value thereof. Thereafter, a second conversion function is defined and the characteristic of a segment to which the previous input value belongs is determined, and thus the true output of the power amplifier can be selected based on Equation 9. The second conversion function is defined as follows:

$$\text{Tran2}(\bullet)=\lfloor\{(\bullet-y(n_i^j))\times e^{-j\angle y(n_i^j)}-M_i\}\rfloor e^{j\angle y(n_i^j)-\angle y(n_i^j-1)} \quad (13)$$

The second conversion function obtains the following characteristic:

$$E[\text{Tran2}(a_1(n_i^j))] = \frac{\Psi_j + \Psi_{j-1}}{2}(K_j - 1) \quad (14)$$

$$E[\text{Tran2}(a_2(n_i^j))] = 0$$

In summary, when there is a memory effect, two intersections are acquired from two input and feedback signals, and only one of them is the true output of the power amplifier. In order to select a true output, the two types of conversion functions have been defined. The value obtained by applying the two intersections to the conversion functions and calculating the average is the same as the result obtained by applying the true output to the conversion functions. The true output can be found using this characteristic. The process may be summarized as in the following Table 2:

TABLE 2

1. N samples are sent, and feedback signals for these N samples are stored.
2. Division into I × J groups is performed based on the sizes of the current and previous inputs of a power amplifier.
3. $a_1(n)$ and $a_2(n)$ are obtained for each of the groups, and the values $c_1(n) = \text{Tran1}[a_1(n)]$ and $c_2(n) = \text{Tran1}[a_2(n)]$ obtained by applying $a_1(n)$ and $a_2(n)$ to the first conversion function are calculated.
4. The average value of $c_1(n) + c_2(n)$ is calculated for each of the groups. If calculation is performed for a sufficient number of samples, this average value becomes the reference value of each of the groups. This becomes $M_j$ of Equation 12. Once $M_j$ has been obtained, the values $t_1(n) = \text{Tran2}[a_1(n)]$ and $t_2(n) = \text{Tran2}[a_2(n)]$ obtained by applying the second conversion function to each of the groups are calculated. If the average value is obtained for a sufficient number of samples, this becomes the reference value of each of the groups.

$$R_i^j = \sum_{n_i^j=1}^{N_i^j}[\text{Tran2}(a_1(n_i^j)) + \text{Tran2}(a_1(n_i^j))]$$

5. Once the reference value has been obtained, the true output of the power amplifier is selected between intersections with respect to newly arriving samples using the following equation:

$\hat{a}(N_i^j + 1) = \arg\min(\|\text{Tran2}(a_1(N_i^j + 1)) - R_i^j\|, \|\text{Tran2}(a_2(N_i^j + 1)) - R_i^j\|)$ —Calculation of Predistortion Parameter (Parameter Estimation Module)—

Once the output of the power amplifier has been successfully estimated at the step of estimating the output of the power amplifier, a predistorter may be designed in various ways by applying conventional predistortion techniques. In an embodiment of the present invention, a method of obtaining a predistortion parameter is described using a polynomial technique as an example.

The nonlinear characteristics of the power amplifier may be represented by a polynomial model having a complex parameter. In this case, the characteristics of the amplifier may be approximately represented by the following Equation 8:

$$\hat{a}(n) = G(y(n)) = \sum_{k=1}^{L} w_k^*|y(n)|^{2(k-1)}y(n) = w^H y(n) \quad (15)$$

where 2L−1 is the nonlinear order of the power amplifier, $\{w_j\}$ is a parameter representative of the characteristics of the power amplifier, $w=[w_1, w_2, \ldots, w_L]^T$, and $y(n)=[y(n), |y(n)|^2 y(n), \ldots, |y(n)|^{2(L-1)}y(n)]^T$.

Since it is generally difficult to obtain the accurate inverse function of the nonlinear model as represented by Equation 15, the approximate model of the inverse function is generally used in the implementation of predistortion. The inverse function of Equation 15 is approximately represented by the following polynomial:

$$y(n) = G^{-1}(x(n)) = \sum_{k=1}^{Q} h_k^*|x(n)|^{2(k-1)}x(n) = h^H x(n) \quad (16)$$

where 2Q−1 is the nonlinear order of the power amplifier, $\{h_k\}$ is a parameter indicative of the characteristics of the power amplifier, $h=[h_1, h_2, \ldots, h_Q]^T$, and $x(n)=[x(n), |x(n)|^2 x(n), \ldots, |x(n)|^{2(Q-1)}x(n)]^T$. In this case, methods for calculating the parameter of the predistorter include a direct learning method and an indirect learning method. Although only the indirect learning method will be described below as an example in an embodiment of the present invention, it may be possible to derive the direct learning method.

FIG. 6 is a block diagram illustrating the polynomial-type predistortion of a digital predistortion apparatus according to an embodiment of the present invention. In this case, when the inverse function $G^{-1}(\bullet)$ of the power amplifier is obtained, it is assumed that PD is in bypass mode. After $G^{-1}(\bullet)$ has been estimated, the parameters thereof are copied to the PD.

In order to update the parameter of the power amplifier using the indirect learning method, the following cost function is defined:

$$\epsilon_h = E\lfloor|e_h(n)|^2\rfloor \quad (17)$$

where $\epsilon_h(n)=y(n)-G^{-1}(a[n])$. In this case, in the baseband, $\hat{a}(n)$ estimated through the feedback value of the envelope detector is used as the output value $a(n)$ of the power amplifier. Then the inverse function characteristics of the amplifier is represented as follows:

$$G^{-1}(n)=h^H\hat{a}(n) \quad (18)$$

where $\hat{a}(n)=[\hat{a}(n), |\hat{a}(n)|^2\hat{a}(n), \ldots, |\hat{a}(n)|^{2(L-1)}\hat{a}(n)]^T$.

The following equation is obtained by substituting Equation 17 into Equation 18 and driving an adaptation algorithm:

$$h(n+1) = h(n) - \mu D\frac{\partial\varepsilon_h}{\partial h^*} \quad (19)$$

$$= h(n) + \mu D\varepsilon_h^*\hat{a}(n)$$

where $\mu a$ is a step size, and D is a diagonal scaling matrix that is used to improve convergence speed. A predistortion parameter may be calculated using Equation 19, and the corresponding parameter is applied to the predistorter after the convergence of the algorithm.

The performance of the predistortion algorithm proposed by the present invention was verified through computer simulations. A simulation environment is as follows:

Transmission bit data was randomly generated, and is modulated by 16-Quadrature Amplitude Modulation (QAM) method. A modulated signal was filtered by a square root raised cosine Pulse Shaping Filter (PSF) having a roll-off value of 0.25. The sampling clock of the PSF is 10 times that of a 16-QAM symbol signal. To model an actual power amplifier, a Saleh model, such as that of Equation 20, was applied. The ideal gain of Equation 20 is assumed to be 1 (K=1).

$$\phi(y(n)) = \frac{1.1 y(n)}{1 + 0.3|y(n)|^2} \exp\left(j \frac{0.8|y(n)|^2}{1 + 3|y(n)|^2}\right) \quad (20)$$

In a partial linear model-based Look-up Table (LUT) method, an input interval was divided into a total of 15 intervals, and 0.5 was used as a step size in Equation 19. In a polynomial predistortion model, a 7th-order polynomial model was used, and [0.05, 3, 6, 10] was used as a diagonal matrix value in order to update the predistortion parameter in Equation 19.

Figure 7:
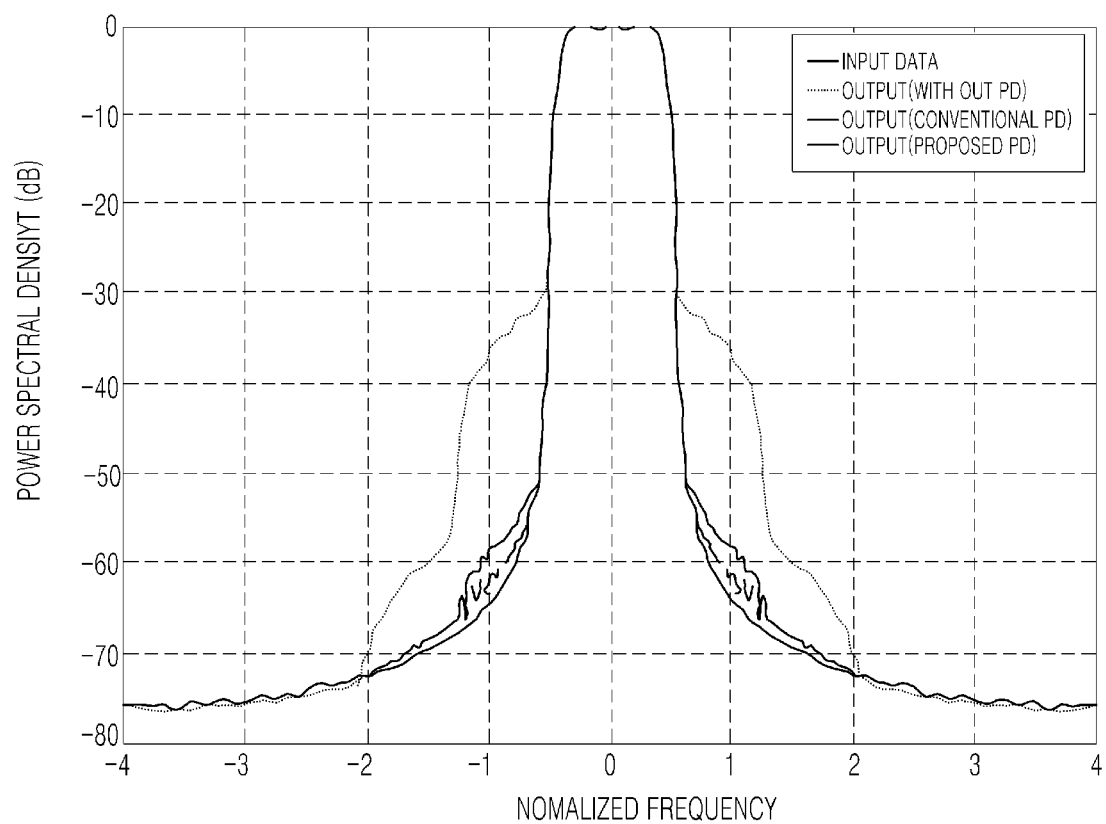
FIG. 7 is a graph illustrating comparisons in spectrum performance in the case where there is no memory effect attributable to a digital predistortion apparatus according to an embodiment of the present invention.

FIG. 7 illustrates spectrum performance with respect to the output of an amplifier. From this diagram, it can be seen that when predistortion was not applied, spectral regrowth occurred because of nonlinear characteristics and it can be seen that the nonlinear effect was almost eliminated by the proposed method.

Figure 8:
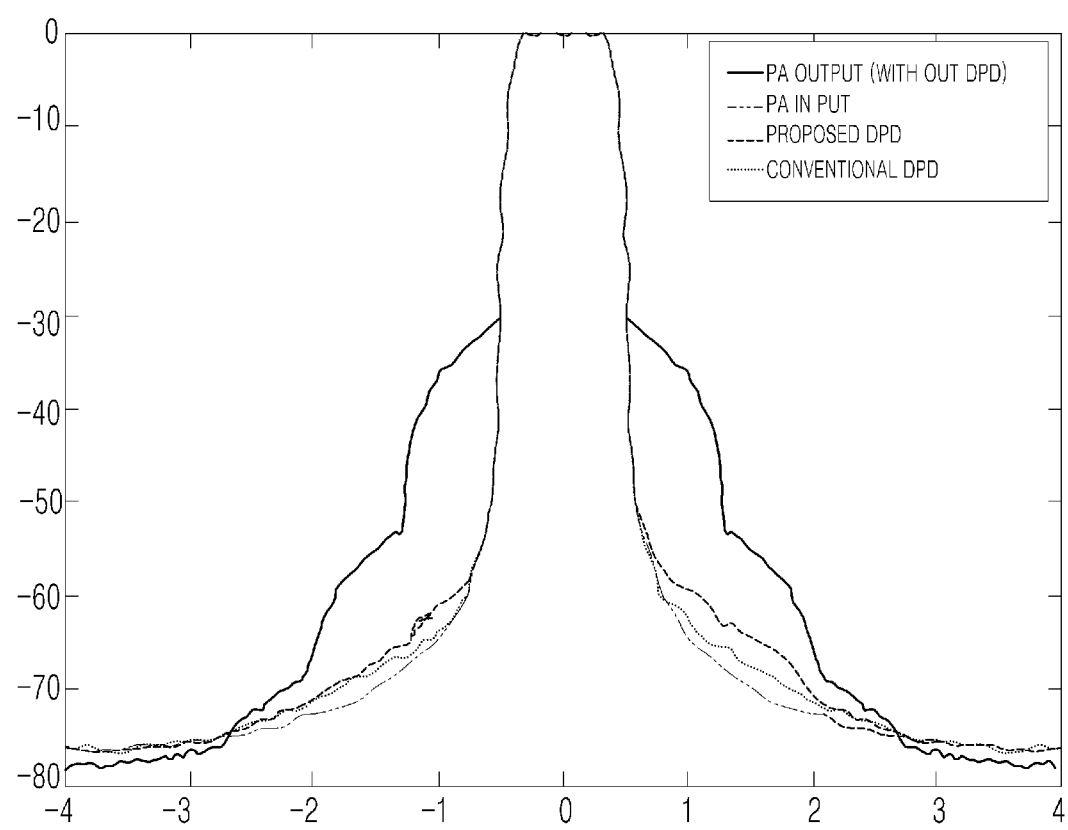
FIG. 8 is a graph illustrating comparisons in spectrum performance in the case where there is a memory effect attributable to a digital predistortion apparatus according to an embodiment of the present invention.

In the case where there is no memory effect, results that were obtained by performing computer simulations on the 2-tap model are shown in FIG. 8. It can be seen that although this case exhibited slightly poorer performance than the case where there was no memory effect, this case also achieved performance that was almost similar to the output result of the amplifier of a system using a feedback loop via a general receiver. As a result, the structure and algorithm proposed by the present invention have the advantages of considerably reducing the cost and volume using an envelope detector instead of implementing a transmitter.

Figure 9:
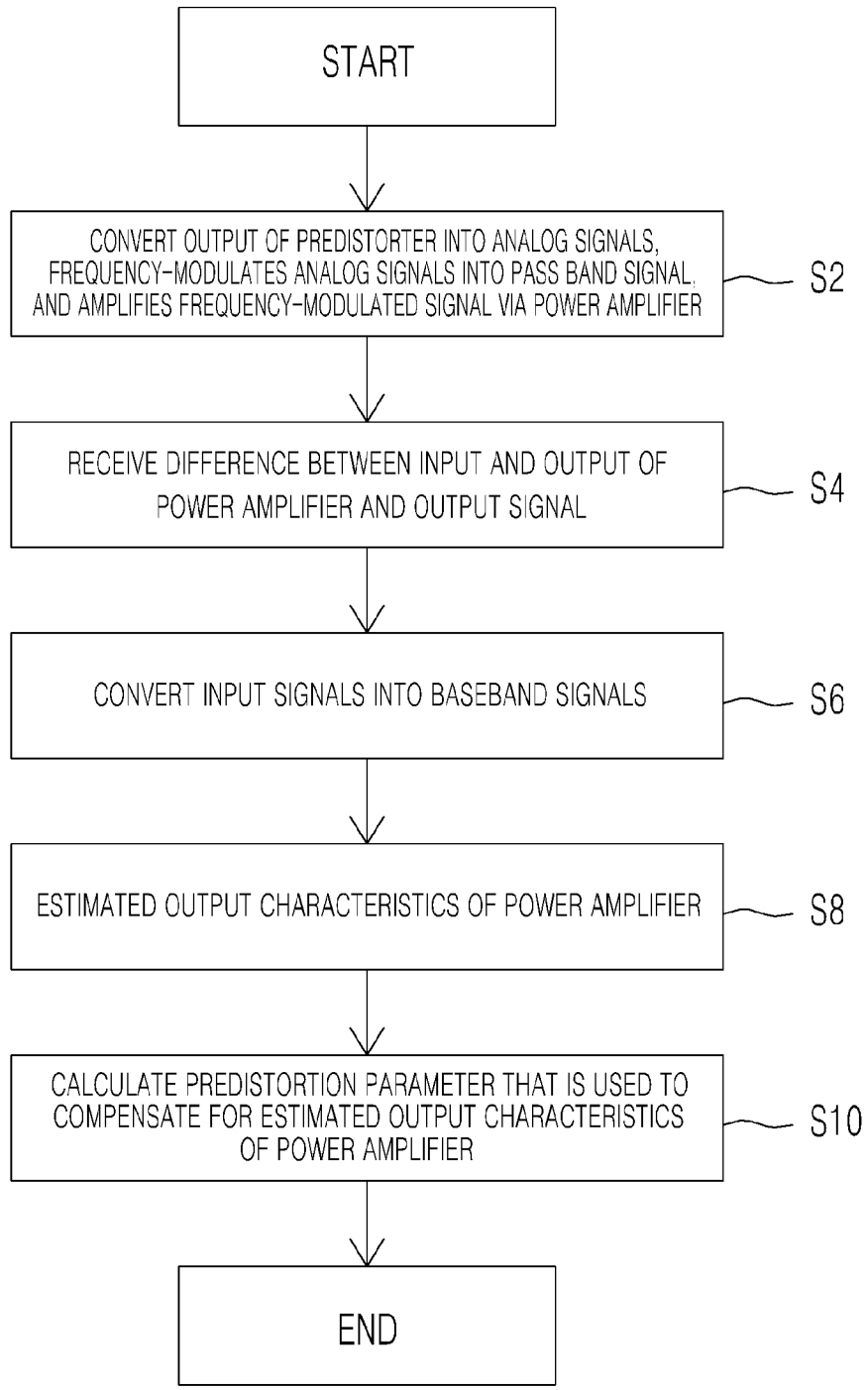
FIG. 9 is a flowchart illustrating a digital predistortion method according to an embodiment of the present invention.

Meanwhile, a method using the low-cost digital predistortion apparatus using envelope detection feedback (a low-cost digital predistortion method using envelope detection feedback) will be described with reference to FIG. 9.

First, the digital predistortion unit 100 converts the output of the predistorter 110 into analog signals, frequency-modulates the analog signals into a pass band signal, and amplifies the frequency-modulated signal via the power amplifier 140 at step S2.

Thereafter, the envelope detection feedback unit 200 receives the difference between the input and output of the power amplifier 140 of the digital predistortion unit 100 and the output of the power amplifier 140 at step S4.

Thereafter, the envelope detection feedback unit 200 converts the difference between the input and output of the power amplifier 140 of the digital predistortion unit 100 and the output of the power amplifier 140 into baseband signals, respectively, at step S6.

Thereafter, the envelope detection feedback unit 200 converts the baseband signals into digital signals, and estimates the nonlinear distortion characteristics of the power amplifier 140 at step S8.

Thereafter, at step S10, the envelope detection feedback unit 200 calculates a predistortion parameter that is used to compensate for the nonlinear distortion characteristics of the power amplifier 140 estimated at step S8.

Figure 10:
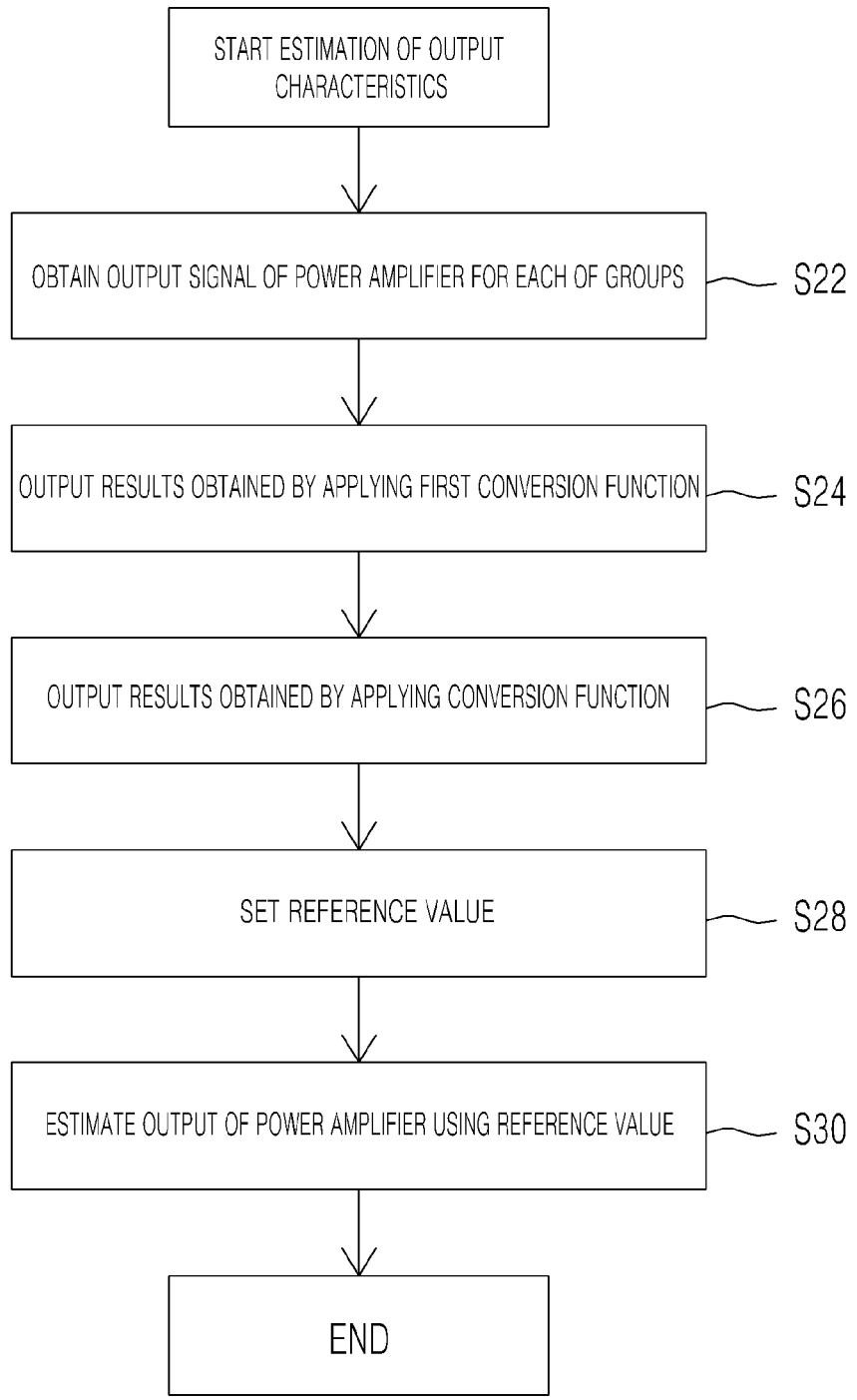
FIG. 10 is a detailed flowchart illustrating the output characteristic estimation of a digital predistortion method according to an embodiment of the present invention.

The step of estimating the output characteristics of the power amplifier according to an embodiment of the present invention will be described with reference to FIG. 10.

The envelope detection feedback unit 200 performs division into a predetermined number of groups using feedback loop signals for N input signals input via the digital predistortion unit based on the sizes of the input signals of the power amplifier at step S22.

Thereafter, the envelope detection feedback unit 200 obtains the output signals $a_1(n)$ and $a_2(n)$ of the power amplifier for each of the groups at step S24.

Thereafter, the envelope detection feedback unit 200 outputs results $c_1(n) = \text{Tran}[a_1(n)]$ and $c_2(n) = \text{Tran}[a_2(n)]$ obtained by applying the output signals of the power amplifier calculated at step S24 to a conversion function (Equation 5) at step S26.

Thereafter, the envelope detection feedback unit 200 sets the average value of the sums of the outputs $c_1(n)$ and $c_2(n)$ of step S26 for each of the groups as the reference value of each of the groups at step S28.

Thereafter, the envelope detection feedback unit 200 estimates the output of the power amplifier using the reference value at step S30.

$$\text{Tran}(\bullet) = (\bullet - y(n)) \times e^{j\angle y(n)} \quad (5)$$

where $\text{Tran}(\bullet)$ is the conversion function, $y(n)$ is the input signals of the power amplifier, and $\angle y(n)$ is the phase of $y(n)$.

Figure 11:
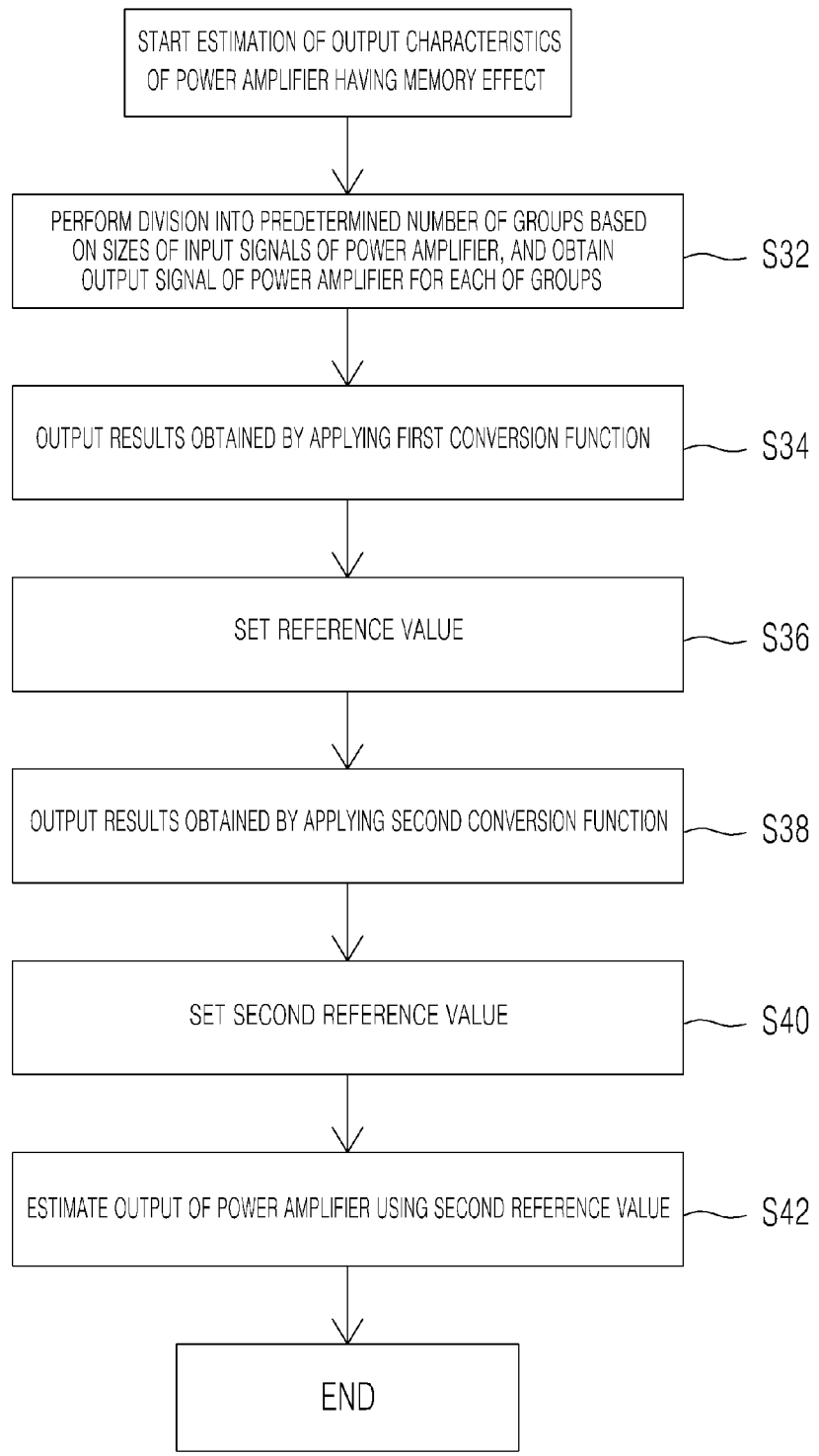
FIG. 11 is a detailed flowchart illustrating the estimation of the output characteristics of a power amplifier having a memory effect in a digital predistortion method according to an embodiment of the present invention.

As illustrated in FIG. 11, when the power amplifier according to an embodiment of the present invention has a memory effect, the envelope detection feedback unit 200 performs division into a predetermined number of groups using the feedback loop signals for the N input signals input via the digital predistortion unit 100 based on the size of the current input signal (an i-th input signal) of the power amplifier and the size of a previous input signal (a j-th input signal), and obtains the output signals $a_1(n)$ and $a_2(n)$ of the power amplifier for each of the groups at step S32.

Thereafter, the envelope detection feedback unit 200 outputs results $c_1(n) = \text{Tran1}[a_1(n)]$ and $c_2(n) = \text{Tran1}[a_2(n)]$ obtained by applying the output signals of the power amplifier calculated at step S32 to a conversion function (Equation 10) at step S34.

Thereafter, the envelope detection feedback unit 200 sets the average value of the sums of the outputs $c_1(n)$ and $c_2(n)$ of step S34 for each of the groups as the reference value of each of the groups at S36.

Thereafter, the envelope detection feedback unit 200 outputs results $t_1(n) = \text{Tran2}[a_1(n)]$ and $t_2(n) = \text{Tran2}[a_2(n)]$ obtained by applying a second conversion function (Equation 13) to each of the groups using the reference value of step S36.

Thereafter, the envelope detection feedback unit 200 sets the average value of the sums of the outputs $t_1(n)$ and $t_2(n)$ of step S38 for each of the groups as the reference value of each of the groups at step S40.

Thereafter, at step S42, the envelope detection feedback unit 200 estimates the output of the power amplifier using the reference value of step S40.

$$\text{Tran1}(\bullet) = (\bullet - y(n_i^j)) \times e^{j\angle y(n_i^j)} \quad (10)$$

where $\text{Tran}(\bullet)$ is the conversion function, $y(n)$ is the input signals of the power amplifier, $\angle y(n)$ is the phase of $y(n)$, and $n_i^j$ is an index indicating that the current input belongs to an i-th interval and the previous input belongs to a j-th interval.

$$\text{Tran2}(\bullet) = \lfloor \{(\bullet - y(n_i^j)) \times e^{-j\angle y(n_i^j)} - M_{ij}\} \rfloor e^{j\angle y(n_i^j) - \angle y(n_i^{j-1})} \quad (13)$$

where $M_i$ is the first reference value, $y(n)$ is the input signals of the power amplifier, $\angle y(n)$ is the phase of $y(n)$, and $n_i^j$ is an index indicating that the current input belongs to an i-th interval and the previous input belongs to a j-th interval.

Figure 12:
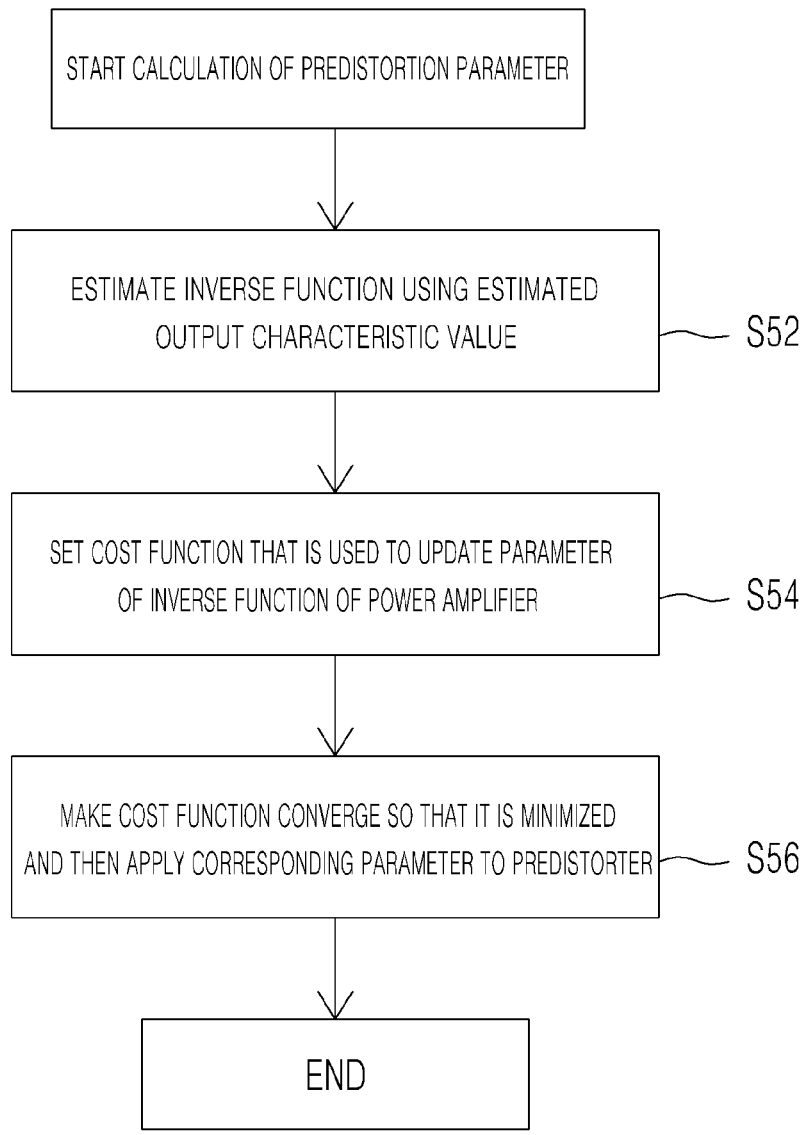
FIG. 12 is a detailed flowchart illustrating the predistortion parameter calculation of a digital predistortion method according to an embodiment of the present invention.

The step of calculating a predistortion parameter that is used to compensate for the output characteristics of the power amplifier estimated at step S8 according to an embodiment of the present invention will be described with reference to FIG. 12.

The envelope detection feedback unit 200 estimates an inverse function using an estimated value â(n) obtained by estimating the output characteristics of the power amplifier 140 at step S52.

Thereafter, at step S54, the envelope detection feedback unit 200 sets a cost function that is used to update the parameter of the inverse function of the power amplifier estimated at step S52.

Thereafter, the envelope detection feedback unit 200 makes the cost function converge and then applies the corresponding parameter to the predistorter at step S56.

The estimated value â(n) is $$\hat{a}(n) = G(y(n)) = \sum_{k=1}^{L} w_k^* |y(n)|^{2(k-1)} y(n) = w^H y(n),$$

where $2L-1$ is the nonlinear order of the power amplifier, $w_k$ is a parameter indicative of the characteristics of the power amplifier, $w=[w_1, w_2, \ldots, w_T]^T$, and $y(n)=[y(n), |y(n)|^2 y(n), \ldots, |y(n)|^{2(L-1)} y(n)]^T$.

The inverse function is $$y(n) = G^{-1}(x(n)) = \sum_{k=1}^{Q} h_k^* |x(n)|^{2(k-1)} x(n) = h^H x(n),$$

where 2Q−1 is the nonlinear order of the power amplifier, $\{h_k\}$ is a parameter indicative of the characteristics of the power amplifier, $h=[h_1, h_2, \ldots, h_Q]^T$, and $x(n)=[x(n), |x(n)|^2 x(n), \ldots, |x(n)|^{2(Q-1)} x(n)]^T$.

The cost function is $\epsilon_h = E[|e_h(n)|^2]$, where the cost function convergence is $$h(n+1) = h(n) - \mu D \frac{\partial \epsilon_h}{\partial h^*} = h(n) + \mu D \epsilon_h^* \hat{a}(n),$$

μ is a step size, and D is a diagonal scaling matrix that is used to improve convergence speed.

As described above, the present invention provides the advantage of achieving predistortion performance comparable to that of the conventional predistortion method using a structure that is cheaper and simpler than the conventional demodulation feedback structure.

Furthermore, the present invention provides the advantage of employing the cheaper and simpler envelope detection method instead of the conventional demodulation method as a new feedback method in order to overcome difficulty implementing feedback loops, thereby enabling a digital predistortion function to be implemented using parts that are cheaper and smaller in number than those of the conventional feedback method.

Moreover, the present invention can be applied to the case where a power amplifier has a memory effect, and exhibited performance comparable to that of the conventional predistortion in spite of the fact that the structure of the feedback loops proposed by computer simulations was simple.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A low-cost digital predistortion apparatus using envelope detection feedback, comprising:
   a digital predistortion unit including
      a predistorter predistorting multiple access modulated input signals, wherein the predistorter bypasses an initial one of the multiple access modulated input signals,
      a digital-to-analog converter coupled to the predistorter and converting outputs of the predistorter into analog signals,
      a modulator coupled to the digital-to-analog converter and frequency-modulating the analog signals from the digital-to-analog converter into pass band signals, and
      a power amplifier coupled to the modulator and amplifying the pass band signals from the modulator; and
   an envelope detection feedback unit including
      an envelope detector receiving feedback signals from the digital predistortion unit and converting the feedback signals to baseband signals, the envelope detector including a first detector and a second detector,
      an analog-to-digital converter coupled to the envelope detector and converting the baseband signals from the envelope detector to digital signals, and
      a predistortion estimator coupled to the analog-to-digital converter, receiving the digital signals from the analog-to-digital converter, estimating a nonlinear distortion characteristic of the output signal of the power amplifier, and calculating a predistortion parameter for compensating the nonlinear distortion characteristic,
   wherein the first detector of the envelope detector receives a first feedback signal from the digital predistortion unit, the first feedback signal being a difference between an input signal (y) of the power amplifier and an output signal (a) of the power amplifier, and
   wherein the second detector of the envelope detector receives a second feedback signal from the digital predistortion unit, the second feedback signal being a difference between a complex conjugate of the input signal (y*) of the power amplifier and the output signal (a) of the power amplifier.

2. The low-cost digital predistortion apparatus of claim 1, wherein the predistortion estimator comprises:
   an output estimation module estimating the nonlinear distortion characteristic of the output signal of the power amplifier using the feedback signals; and
   a parameter estimation module calculating the predistortion parameter for compensating the nonlinear distortion characteristic of the output signal of the power amplifier.

3. The low-cost digital predistortion apparatus of claim 2, wherein the output estimation module comprises:
   an output signal calculation means for grouping input signals of the power amplifier into groups based on a magnitude the input signals, and obtaining output signals $a_1(n)$ and $a_2(n)$ of the power amplifier for each of the groups;

a conversion means converting the output signals $a_1(n)$ and $a_2(n)$ from the output signal calculation means to outputs $c_1(n)=\text{Tran}[a_1(n)]$ and $c_2(n)=\text{Tran}[a_2(n)]$ by using a conversion function $\text{Tran}(\bullet)=(\bullet-y(n))\times e^{j\angle y(n)}$, where $\text{Tran}(\bullet)$ is the conversion function, $y(n)$ is the input signals of the power amplifier, and $\angle y(n)$ is a phase of $y(n)$;

a setting means calculating an average value of the outputs $c_1(n)$ and $c_2(n)$ of the conversion means for each of the groups, and setting the average value as a reference value of the group; and an estimation means for estimating the output signals of the power amplifier using the reference value of the setting means.

4. The low-cost digital predistortion apparatus of claim 2, wherein the output estimation module further comprises:

an output signal calculation means for grouping a current input signal (an i-th input signal) and a previous input signal (a j-th input signal) of the power amplifier into groups based on a magnitude the input signals, and obtaining output signals $a_1(n)$ and $a_2(n)$ of the power amplifier for each of the groups;

a first conversion means for outputting results converting the output signals $a_1(n)$ and $a_2(n)$ from the output signal calculation means to outputs $c_1(n)=\text{Tran1}[a_1(n)]$ and $c_2(n)=\text{Tran1}[a_2(n)]$ by using a first conversion function $\text{Tran1}(\bullet)=(\bullet-y(n_i^j))\times e^{j\angle y(n_i^j)}$, where $\text{Tran1}(\bullet)$ is the first conversion function, $y(n)$ is the input signals of the power amplifier, $\angle y(n)$ is a phase of $y(n)$, and $n_i^j$ is an index indicating that the current input belongs to an i-th interval and the previous input belongs to a j-th interval;

a first setting means calculating an average value of the outputs $c_1(n)$ and $c_2(n)$ of the first conversion means for each of the groups and setting the average value as a dirst reference value of each of the groups;

a second conversion means converting the output signals $a_1(n)$ and $a_2(n)$ from the output signal calculation means to outputs $t_1(n)=\text{Tran2}[a_1(n)]$ and $t_2(n)=\text{Tran2}[a_2(n)]$ by using a second conversion function $\text{Tran2}(\bullet)=\lfloor\{(\bullet-y(n_i^j))\times e^{-j\angle y(n_i^j)}-M_i\}e^{j\angle y(n_i^j)-\angle y(n_i^{j-1})}$ where $\text{Tran2}(\bullet)$ is the second conversion function, $M_i$ is the first reference value;

a second setting means calculating an average value of the outputs $t_1(n)$ and $t_2(n)$ of the second conversion means for each of the groups and setting the average value as a second reference value of each of the groups; and an estimation means for estimating the output signals of the power amplifier using the second reference value of the second setting means.

5. The low-cost digital predistortion apparatus of claim 2, wherein the parameter estimation module comprises:

an inverse function estimation means for estimating an inverse function using an estimated value $\hat{a}(n)$ obtained by estimating the nonlinear distortion characteristic of the power amplifier;

a cost function setting means for setting a cost function that is used to update the predistortion parameter of the inverse function of the power amplifier estimated via the inverse function estimation means; and a cost function convergence means for making the cost function of the cost function setting means converge and then applying a corresponding parameter to the predistorter, wherein the estimated value $a(n)$ is $$\hat{a}(n) = G(y(n)) = \sum_{k=1}^{L} w_k^* |y(n)|^{2(k-1)} y(n) = w^H y(n),$$

where $2L-1$ is the nonlinear order of the power amplifier, $w_k$ is a parameter indicative of the characteristics of the power amplifier, $w=[w_1, w_2, \ldots, w_T]^T$, and $$y(n)=[y(n),|y(n)|^2 y(n),\ldots,|y(n)|^{2(L-1)} y(n)]^T,$$

wherein the inverse function is $$y(n) = G^{-1}(x(n)) = \sum_{k=1}^{Q} h_k^* |x(n)|^{2(k-1)} x(n) = h^H x(n),$$

where $2Q-1$ is the nonlinear order of the power amplifier, $\{h_k\}$ is a parameter indicative of the characteristics of the power amplifier, $h=[h_1, h_2, \ldots, h_Q]^T$, and $$x(n)=[x(n),|x(n)|^2 x(n),\ldots,|x(n)|^{2(Q-1)} x(n)]^T, \text{ and}$$

wherein the cost function is $\epsilon_h=\lfloor |e_h(n)|^2 \rfloor$, where the cost function convergence is $$h(n+1) = h(n) - \mu D \frac{\partial \epsilon_h}{\partial h^*} = h(n) + \mu D \epsilon_h^* \hat{a}(n),$$

$\mu$ is a step size, and D is a diagonal scaling matrix that is used to improve convergence speed.

6. A low-cost digital predistortion method using envelope detection feedback, comprising the steps of:

(a) predistorting, by a predistorter, multiple access modulated input signals, wherein the predistorter bypasses an initial one of the multiple access modulated input signals; converting, by a digital-to-analog converter, output signals of the predistorter into analog signals; frequency-modulating, by a modulator, the analog signals into pass band signals; and amplifying, by a power amplifier, the pass band signals from the modulator;

(b) receiving, by an envelope detector, feedback signals from the power amplifier, the envelope detector including a first detector and a second detector, wherein the first detector of the envelope detector receives a first feedback signal from the power amplifier, the first feedback signal being a difference between an input signal (y) of the power amplifier and an output signal (a) of the power amplifier, and wherein the second detector of the envelope detector receives a second feedback signal from the power amplifier, the second feedback signal being a difference between a complex conjugate of the input signal (y*) of the power amplifier and the output signal (a) of the power amplifier;

(c) converting, by the envelope detector, the the feedback signals to baseband signals, respectively;

(d) converting, by an analog-to-digital converter, the baseband signals from the envelope detector into digital signals; estimating, by a predistortion estimator, nonlinear distortion characteristics of the power amplifier; and (e) calculating, by the predistortion estimator, a predistortion parameter for compensating the nonlinear distortion characteristics of the power amplifier estimated at step (d).

7. The low-cost digital predistortion method of claim 6, wherein step (d) comprises the steps of:
- (d-1) grouping, by an output signal calculation means of the predistortion estimator, input signals of the power amplifier i into groups based on a magnitude the input signals;
- (d-2) obtaining, by the envelope detection feedback unit, 200 output signal calculation means, output signals $a_1(n)$ and $a_2(n)$ of the power amplifier for each of the groups;
- (d-3) converting, by an conversion means of the predistortion estimator, the output signals $a_1(n)$ and $a_2(n)$ from the output signal calculation means to outputs $c_1(n)$=Tran$[a_1(n)]$ and $c_2(n)$=Tran$[a_2(n)]$ by using a conversion function
Tran$(\bullet)=(\bullet-y(n))\times e^{j\angle y(n)}$, where Tran$(\bullet)$ is the conversion function, $y(n)$ is the input signals of the power amplifier, and $\angle y(n)$ is a phase of $y(n)$;
- (d-4) calculating, by a setting means of the predistortion estimator, an average value of the outputs $c_1(n)$ and $c_2(n)$ of step (d-3) for each of the groups and setting the average value as a reference value of each of the groups; and
- (d-5) estimating, by an estimation means of the predistortion estimator, the output signals of the power amplifier using the reference value.

8. The low-cost digital predistortion method of claim 6, wherein step (d) comprises, when the power amplifier has a memory effect, the steps of:
- (d-1') grouping, by a output signal calculation means of the predistortion estimator, an input signal (an i-th input signal) and a previous input signal (a j-th input signal) of the power amplifier into groups based on a magnitude the input signals; obtaining, by the output signal calculation means, output signals $a_1(n)$ and $a_2(n)$ of the power amplifier for each of the groups,
- (d-2') converting, by a first conversion means of the predistortion estimator, the output signals $a_1(n)$ and $a_2(n)$ from the output signal calculation means to outputs $c_1(n)$=Tran1$[a_1(n)]$ and $c_2(n)$=Tran1$[a_2(n)]$ by using a first conversion function
Tran$(\bullet)=(\bullet-y(n))\times e^{j\angle y(n)}$ where Tran$(\bullet)$ is the first conversion function, $y(n)$ is the input signals of the power amplifier, and $\angle y(n)$ is a phase of $y(n)$;
- (d-3') calculating, by a first setting means of the predistortion estimator, an average value of the outputs $c_1(n)$ and $c_2(n)$ of step (d-2') for each of the groups and setting the average value as a first reference value of each of the groups;
- (d-4') converting, by a second conversion means of the predistortion estimator, the output signals $a_1(n)$ and $a_2(n)$ from the output signal calculation means to outputs $t_1(n)$=Tran2$[a_1(n)]$ and $t_2(n)$=Tran2$[a_2(n)]$ by using a second conversion function
Tran2$(\bullet)=\lfloor\{(\bullet-y(n_i^j))\times e^{-j\angle y(n_i^j)}-M_i\}\rfloor e^{j\angle y(n_i^j)-\angle y(n_i^j-1)}$, where Tran2$(\bullet)$ is the second conversion function, $M_i$ is the first reference value;
- (d-5') calculating, by a second setting means of the predistortion estimator, an average value of outputs $t_1(n)$ and $t_2(n)$ of step (d-4') for each of the groups and setting the average value as a second reference value of each of the groups; and
- (d-6') estimating, by an estimation means, the output signals of the power amplifier using the second reference value.

9. The low-cost digital predistortion method of claim 6, wherein step (e) comprises the steps of:
- (e-1) estimating, by an inverse function estimation means of the predistortion estimator, an inverse function using an estimated value $\hat{a}(n)$ obtained by estimating output characteristics of the power amplifier;
- (e-2) setting, by a cost function setting means of the predistortion estimator, a cost function that is used to update a parameter of the inverse function of the power amplifier estimated at step (e-1); and
- (e-3) making, by a cost function convergence means of the predistortion estimator, the cost function converge, and then applying a corresponding parameter to the predistorter, wherein the estimated value $\hat{a}(n)$ is $$\hat{a}(n) = G(y(n)) = \sum_{k=1}^{L} w_k^* |y(n)|^{2(k-1)} y(n) = w^H y(n),$$

where $2L-1$ is a nonlinear order of the power amplifier, $w_k$ is a parameter indicative of the characteristics of the power amplifier, $w=[w_1, w_2, \ldots, w_T]^T$, and $$y(n)=[y(n),|y(n)|^2 y(n),\ldots,|y(n)|^{2(L-1)}y(n)]^T,$$

wherein the inverse function is $$y(n) = G^{-1}(x(n)) = \sum_{k=1}^{Q} h_k^* |x(n)|^{2(k-1)} x(n) = h^H x(n),$$

where $2Q-1$ is a nonlinear order of the power amplifier, $\{h_k\}$ is a parameter indicative of the characteristics of the power amplifier, $h=[h_1, h_2, \ldots, h_Q]^T$, and $$x(n)=[x(n),|x(n)|^2 x(n),\ldots,|x(n)|^{2(Q-1)}x(n)]^T, \text{ and}$$

wherein the cost function is $\epsilon_h=\lfloor|e_h(n)|^2\rfloor$, where the cost function convergence is $$h(n+1) = h(n) - \mu D\frac{\partial \epsilon_h}{\partial h^*} = h(n) + \mu D\epsilon_h^* \hat{a}(n),$$

$\mu$ is a step size, and D is a diagonal scaling matrix that is used to improve convergence speed.

* * * * *